United States Patent [19]

Ghoshal et al.

[11] Patent Number: 5,077,529
[45] Date of Patent: Dec. 31, 1991

[54] WIDE BANDWIDTH DIGITAL PHASE LOCKED LOOP WITH REDUCED LOW FREQUENCY INTRINSIC JITTER

[75] Inventors: Sajol C. Ghoshal, Orangeville; Daniel L. Ray, Fair Oaks, both of Calif.

[73] Assignee: Level One Communications, Inc., Folsom, Calif.

[21] Appl. No.: 382,258

[22] Filed: Jul. 19, 1989

[51] Int. Cl.$^5$ .................. H03D 3/24; H03K 5/13
[52] U.S. Cl. .................. 328/155; 328/133; 307/511; 331/25; 375/118; 375/120
[58] Field of Search ............. 328/133, 134, 155, 55; 331/1 A, 25; 377/47, 118; 307/511; 375/118, 120

[56] References Cited

U.S. PATENT DOCUMENTS

| | | | |
|---|---|---|---|
| 3,516,007 | 6/1970 | Bos et al. | 331/18 |
| 3,731,219 | 5/1973 | Mader et al. | 331/14 |
| 3,931,585 | 1/1976 | Barker et al. | 328/134 |
| 4,091,335 | 5/1978 | Giolma et al. | 331/1 A |
| 4,129,748 | 12/1978 | Saylor | 178/69 |
| 4,242,639 | 12/1980 | Boone | 328/55 |
| 4,270,183 | 5/1981 | Robinson et al. | 364/900 |
| 4,303,837 | 12/1981 | Ansaldi et al. | 328/155 |
| 4,360,788 | 11/1982 | Erps et al. | 331/1 A |
| 4,539,531 | 9/1985 | Thomas et al. | 331/11 |
| 4,565,976 | 1/1986 | Campbell | 331/57 |
| 4,584,695 | 4/1986 | Wong et al. | 375/81 |
| 4,633,488 | 12/1986 | Shaw | 375/120 |
| 4,667,168 | 5/1987 | Shiomi et al. | 331/25 |
| 4,706,040 | 11/1987 | Mehrgardt | 331/25 |
| 4,712,223 | 12/1987 | Nelson | 328/63 |
| 4,712,224 | 12/1987 | Nelson | 328/63 |
| 4,733,197 | 3/1988 | Chow | 331/1 A |
| 4,771,251 | 9/1988 | Allen et al. | 331/57 |
| 4,805,198 | 2/1989 | Stern et al. | 375/118 |
| 4,855,683 | 8/1989 | Troudet et al. | 328/155 |
| 4,860,288 | 8/1989 | Teske et al. | 375/118 |
| 4,941,156 | 7/1990 | Stern et al. | 375/118 |
| 4,955,040 | 9/1990 | Sarkoezi | 328/155 |

OTHER PUBLICATIONS

"IEEE Standard Dictionary of Electrical and Electronic Term", 7-20-84, p. 149.
C. Shih and S. Sun, "Jitter Attenuation Phase Lock Loop Using Switched Capacitor Controlled Crystal Oscillator", Proceedings of the IEEE 1988.

Primary Examiner—Stanley D. Miller
Assistant Examiner—Terry D. Cunningham
Attorney, Agent, or Firm—Merchant, Gould, Smith, Edell, Welter & Schmidt

[57] ABSTRACT

A device (16) for reducing the intrinsic low frequency jitter within a Digital Phase lock loop (17). A Digital Phase lock loop high speed clock signal (4) is produced by a multistage oscillator (5), producing a plurality of identical frequency signals, each differing in phase. An adjust signal (18) generated by the Digital Phase lock loop output clock signal (3) causes an adjacent phase angle to be selected as the high speed clock signal (4), thereby reducing the period of the clock signal (4) and, in effect, accelerating the high speed clock signal (4). The current state of the selected phase and the appropriate selection of adjacent phase is monitored by a ten stage shift register (20–29), the presence of a "high bit" within a particular shift register block causing selection of the individual phase (6–15) which serves as the input to that particular shift register stage. An error correction circuit (40) detects the presence of more or less than a single high bit within the shift register stages (20–29).

12 Claims, 8 Drawing Sheets

WIDE BANDWIDTH DIGITAL PHASE LOCKED LOOP WITH REDUCED LOW FREQUENCY INTRINSIC JITTER

FIELD OF THE INVENTION

This invention relates to a Digital Phase Locked Loop Apparatus and, more particularly, to such an apparatus that reduces the amount of intrinsic jitter (quavering) appearing on the output signal.

DESCRIPTION OF RELATED TECHNOLOGY

Figure 1:
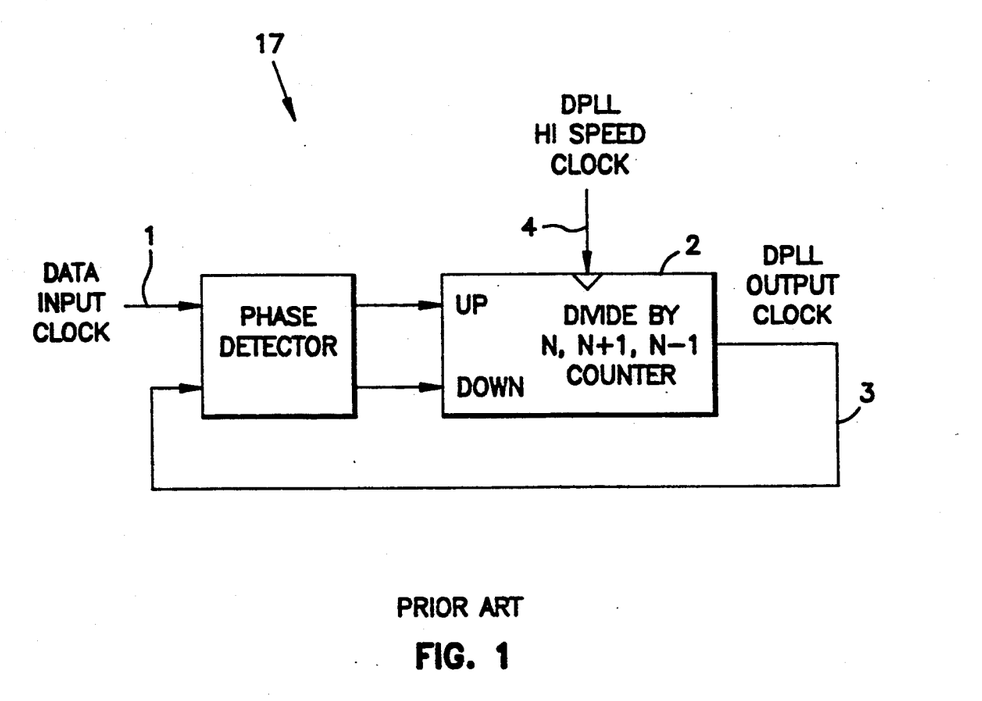
FIG. 1 is a block diagram of a portion of a Digital Phase Locked Loop.

A portion of a Digital Phase Locked Loop (DPLL) is shown in FIG. 1. Such circuits are used to lock to and track an input signal 1 with instability or jitter. The higher the frequency of jitter on the input signal, the higher the bandwidth requirements of the DPLL. Details of this circuit are described in many texts and referenced in many patents. Therefore, the detailed operation of the Digital Phase locked loop will not be described here. Well known Reference describing the operation of the Digital Phase locked loop include Digital Communications by Edward A. Lee and David G. Messerschmitt (published by Klewes Academic Publishers) and Phase Locked Loops - Theory, Design and Applications by Dr. Roland E. Best (McGraw-Hill, 1984).

The bandwidth of the DPLL is controlled by the divider 2 ratio N. However, this division algorithm also generates an output clock signal 3 which has intrinsic jitter. The intrinsic jitter is in the form of a sawtooth waveform whose peak amplitude is 1/N of the bit period or 1/N UI (unit intervals). The frequency of this jitter is N times the frequency difference between the incoming data clock 1 and the DPLL high frequency clock signal 4 divided by N. Therefore, the intrinsic jitter amplitude is always 1/N UI for frequencies higher or lower than the frequency of signal 3.

In certain applications low frequency jitter on the order of 1 Hz to 100 Hz may not be acceptable at the relatively high jitter amplitude of 1/N UI. One way to reduce intrinsic jitter is to increase N. This will require a higher frequency DPLL clock signal 4 which may not be easy to generate and which will also reduce the bandwidth of the DPLL.

A novel scheme which reduces the low frequency jitter component is now described. This scheme leaves the DPLL unchanged, thus keeping the bandwidth and DPLL clock frequency unchanged. The present invention employs a modification of the DPLL high frequency clock signal 4.

SUMMARY OF THE INVENTION

In most data recovery systems the DPLL high frequency clock signal 4 is derived from a multi stage relaxation oscillator whose frequency is locked to a reference clock thru a charge pump phase locked loop. Details of the operation of a charge pump phase locked loop, using a multistage relationation oscillator will not be described here as it is well described in many texts and U.S. patents. One reference is in the book "Phase Lock Techniques" by Floyd M. Gardner, published by John Wiley and Sons. In the present invention, instead of selecting one phase of the multi stage oscillator output to provide the DPLL clock signal, multiplexing circuitry is added such that any consecutive phase of the multi phase oscillator can be selected on command. The output of this multiplexer is the DPLL high frequency clock signal 4. If, during every bit period, the multiplexer is advanced to select the next consecutive oscillator phase, the next DPLL clock signal will advance or retard itself by one oscillator phase delay.

If the number of oscillator stages having different phases is: W
the frequency of the DPLL high frequency clock is: $f_c$
the DPLL division integer is: N
the input data rate clock is: $f_d$
and the delay between each oscillator stage is: D
Then:

$$f_d = f_c/N$$

and $$D = 1/(W f_c) = 1/(W N f_d)$$

The DPLL high frequency clock signal 4 is advanced one oscillator delay period D for every data clock cycle. After W data clock cycles have occurred, the output clock of the DPLL will be ahead of the input data clock by 1/N of the data period. This causes the DPLL to make a correction by dividing by N-1, and bringing the data clock edge in lock with the DPLL clock edge. The DPLL output clock will, therefore, slip by 1/(W*N) of the data period every cycle, for W data cycles, before being corrected. This is, in effect, a sawtooth jitter component on the output of the DPLL whose amplitide is 1/N UI and whose frequency is 1/W of the data rate, which is a relatively high frequency if W is 10.

However, when the input data clock is offset in frequency by a few hertz, the high frequency sawtooth jitter component is modulated by this low frequency component. The amplitude of this low frequency component is not 1/N UI but 1/(N*W) UI. The frequency of this jitter in (N*W) times the difference in frequency between $f_d$ and $f_c/N$. Thus, it one used a ten stage multistage oscillator, the low frequency jitter from the DPLL can be reduced by ten times (in amplitude) as compared to a convential DPLL, while still maintaining the large bandwidth requirements of the DPLL.

In the case of a normal DPLL being supplied with an input data stream which is offset in frequency by a few Hertz, the DPLL output clock jitter is also in the low frequency band. For example, with a 12X clock signal 4 driving the DPLL and the incoming data rate signal 1 with a frequency error 1-10 Hz, a sawtooth jitter waveform of amplitude 0.0833 unit intervals peak to peak (1/12 unit intervals) and of a frequency equal to N times the beat frequency is produced at the output 46 of the DPLL. ,This output clock is now input into a Jitter Attenuation Logic JAL (not shown). Since the conventional JAL has a large signal bandwidth of about 100-200 Hz (small signal bandwidth is less than 10Hz), the low frequency jitter from the DPLL is passed through the JAL without attenuation. The low frequency output jitter specifications for intrinsic jitter in some applications is as low as 0.01 unit intervals peak to peak. Hence, due the coarse incremental steps of the DPLL, the output specification of the JAL is not achieved, and the jitter is, in fact, in excess of eight times the permissible amount.

In the present invention the DPLL output jitter is in the high frequency band with a low frequency component whose amplitude is much lower than that of the normal DPLL. The present invention is useful for systems which require low amplitudes of low frequency jitter, but can effectively handle large amplitudes of high frequency jitter.

DETAILED DESCRIPTION OF THE PREFERRED EMBODIMENT

Figure 2:
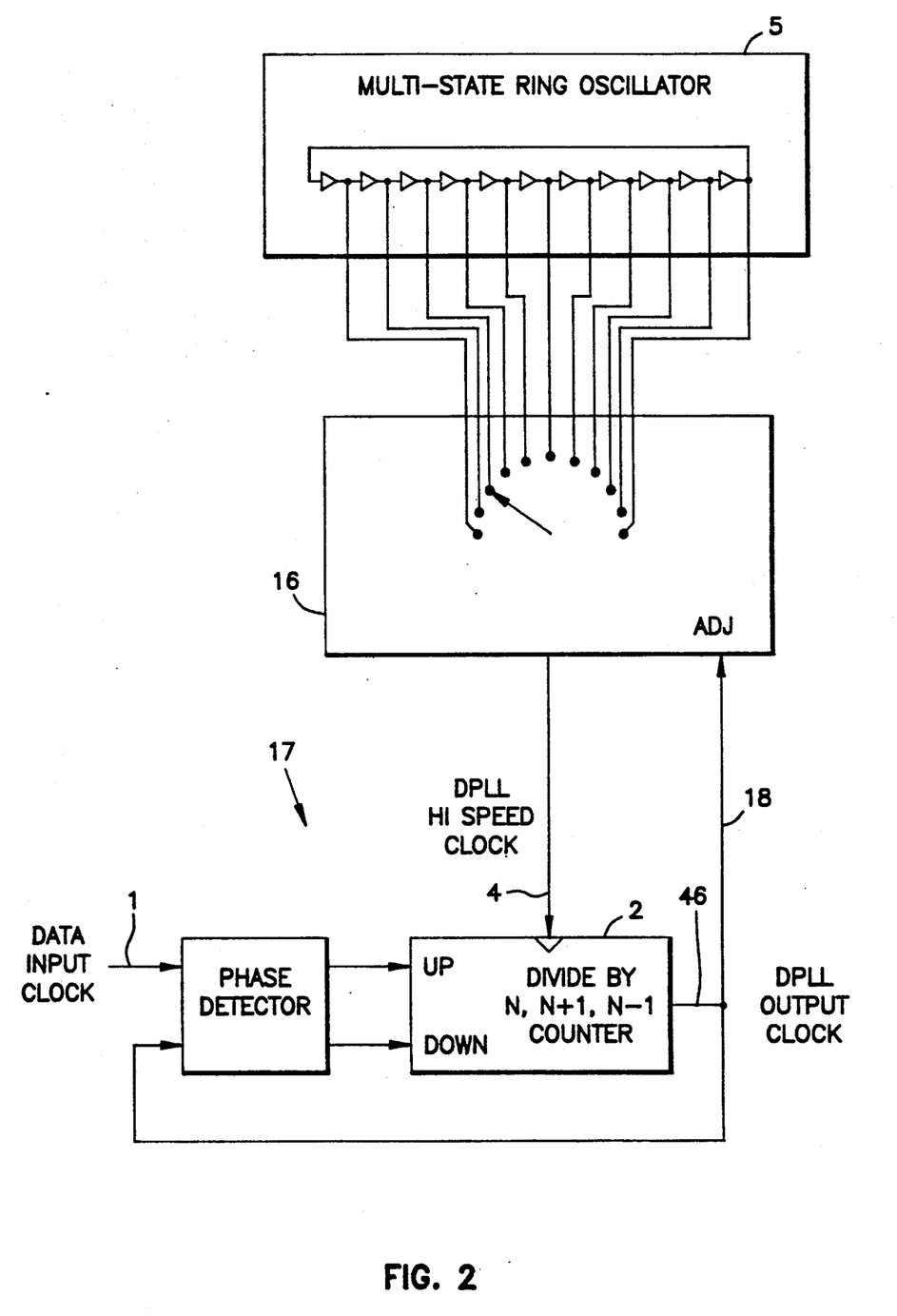
FIG. 2 is a block diagram of a Digital Phase Locked Loop constructed in accordance with the principles of the present invention.

FIG. 2 illustrates a preferred embodiment for the present invention, which discloses a digital phase lock loop having a multistage oscillator 5 and frequency adjustment circuit 16. The frequency adjustment circuit 16 allows any consecutive phase of the oscillator 5 to be selected. The output of the frequency adjustment circuit 16 is a high frequency clock signal 4 used to clock the digital phase lock loop. The frequency adjustment circuit 16 may be advanced or retarded during every bit period to select a next consecutive phase, so that the clock signal 4 is advanced or retarded by one phase delay. The present invention reduces the low frequency jitter of the digital phase lock loop by ten times (in amplitude) as compared to a conventional digital phase lock loop, while maintaining the large bandwidth requirements of the digital phase lock loop.

Figure 3:
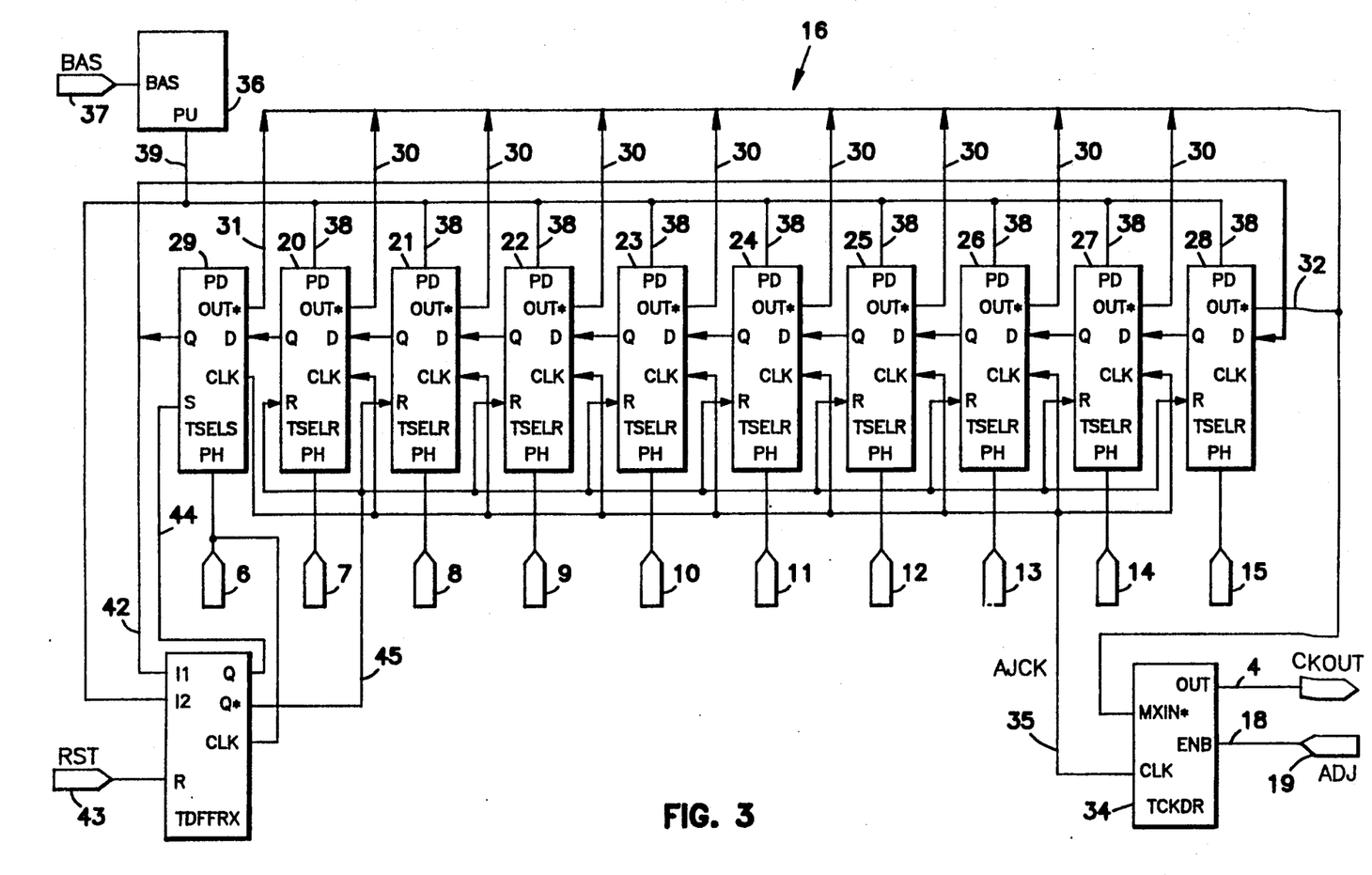
FIG. 3 is a schematic diagram of the frequency adjustment portion of the Digital Phase Locked Loop depicted in FIG. 2.

Referring to FIG. 3, the main function of circuit 16 is to provide a clock signal 4 operating at a frequency twelve times greater than the DPLL timing recovery circuit, whose frequency can be adjusted by small increments. The need to adjust the frequency of the DPLL clock 4 is required to reduce the intrinsic output jitter of the DPLL signal 46 when the incoming data stream frequency 1 is off by a few parts per million (ppm) in frequency.

The present invention reduces the output jitter of the DPLL without reducing its bandwidth. Referring to FIG. 2, a high speed clock signal 4 operating at twelve times the DPLL frequency clock 46 is produced from a five stage current controlled oscillator 5. The current controlled oscillator 5 has five output comparators with complementary outputs. Referring to FIG. 3, this produces ten different phase signals 6,7,8,9,10,11,12,13,14,15 each offset from the nearest phase by 36°, or, for example, 4ns for a data rate of 2.048 Mhz. The number of phases (ten) is selected in order reduce the peak to peak output jitter from the DPLL to below 0.01 unit intervals peak to peak.

Referring particularly to FIG. 3, the novel frequency adjustment circuit 16 of the present invention causes the clock frequency 4 to only speed up and never slow down. The 12X clock signal 4 going to the DPLL 17 reduces its period by 36°, or, for example, 4ns every time the circuit 16 is given an adjust signal 18 at input terminal 19. This has the effect of speeding up the DPLL 12× clock signal 4 and hence, increases the beat frequency of the DPLL output jitter. However, a low beat frequency jitter component is still present, with the exception that it is amplitude is 0.00833 unit intervals peak to peak (1/120 unit interval) and hence, within the specification for the output jitter requirements of the JAL.

System study analysis of circuit 16 shows that low amplitude jitter is produced if an adjust signal 18 is generated every time a mark (high) is received along signal path 1. Since the DPLL 17 is required to receive marks successfully after long strings of zeros (one hundred) and to produce a receive clock locked to the reference clock during the reception of zeros, no adjust signals 18 are generated during the reception of zeros.

Figure 9:
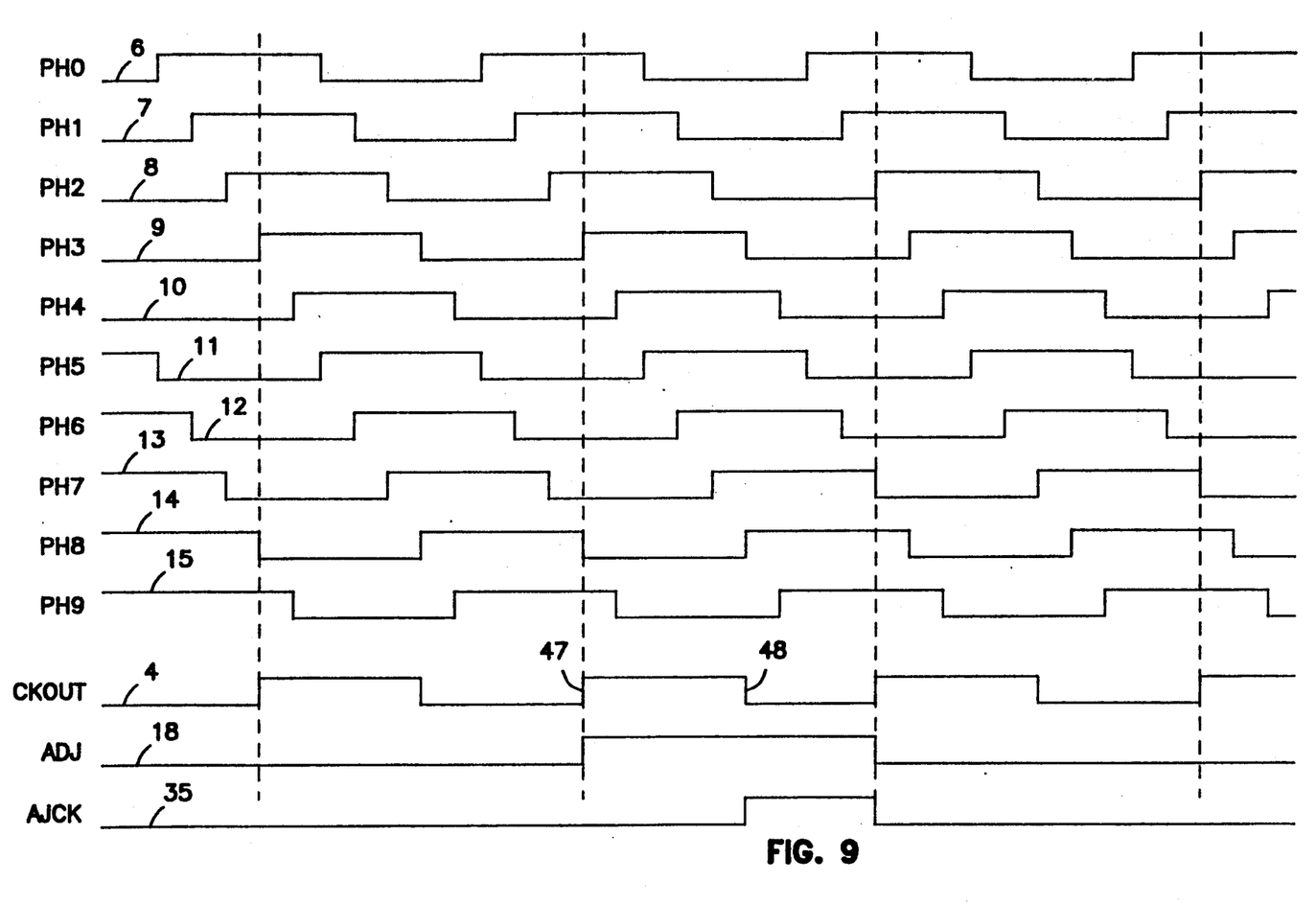
FIG. 9 is a comparative diagram of various waveforms appearing in a device constructed in accordance with the principles of the present invention.

The circuit 16 includes a ten stage closed loop shift resister controlling a ten input multiplexer. The shift resister is clocked every time an adjust signal 18 is received, thereby advancing the '1000000000' pattern through the register. The '1' in a shift resister selects one of the ten phases 6–15. The adjust signal 18 which is the digital phase locked loop output signal 46, and which operates at 1/12th of the multistage oscillator signal 4, is on for one cycle of the 12× clock signal 4 going to the DPLL 17. The adjust signal 18 changes on the rising edge 47 of the clock output signal 4 (see FIG. 9). The adjust signal 18 produces a shift register clock signal 35 which goes high as long as the clock output signal 4 is low. Hence, the shift register is clocked on the falling edge 48 of CKOUT signal 4. At a 2.048 MHz data rate, the 12× clocks have a period of approximately 40ns. Therefore, from the falling edge 48 of CKOUT signal 4 to the next speed-up clock phase is 16ns (20ns−4ns). This requires that for the shift register and multiplexer to successfully select the next phase, the maximum delay from the falling edge 18 of CKOUT signal 4 to the next bit of the shift resister going to '1' should be less than 16ns in the worst case process condition. The shift resister, multiplexer and resetting logic are in the cell TSELR (20–28) and TSELS 29. The worst case delay from the falling edge 48 of CKOUT to the rising edge of an output from the shift resister is 13ns.

The additional design requirement is that the shift resister always correct itself if it is not in a '1000000000' mode. This is solved by resetting the shift resister if an "all zeroes" pattern is detected, or a pattern in which the first bit is '1' and one other bit in the remaining nine bits is also a '1'. The circuit has a programmable option of disabling this feature should it become necessary.

Figure 6:
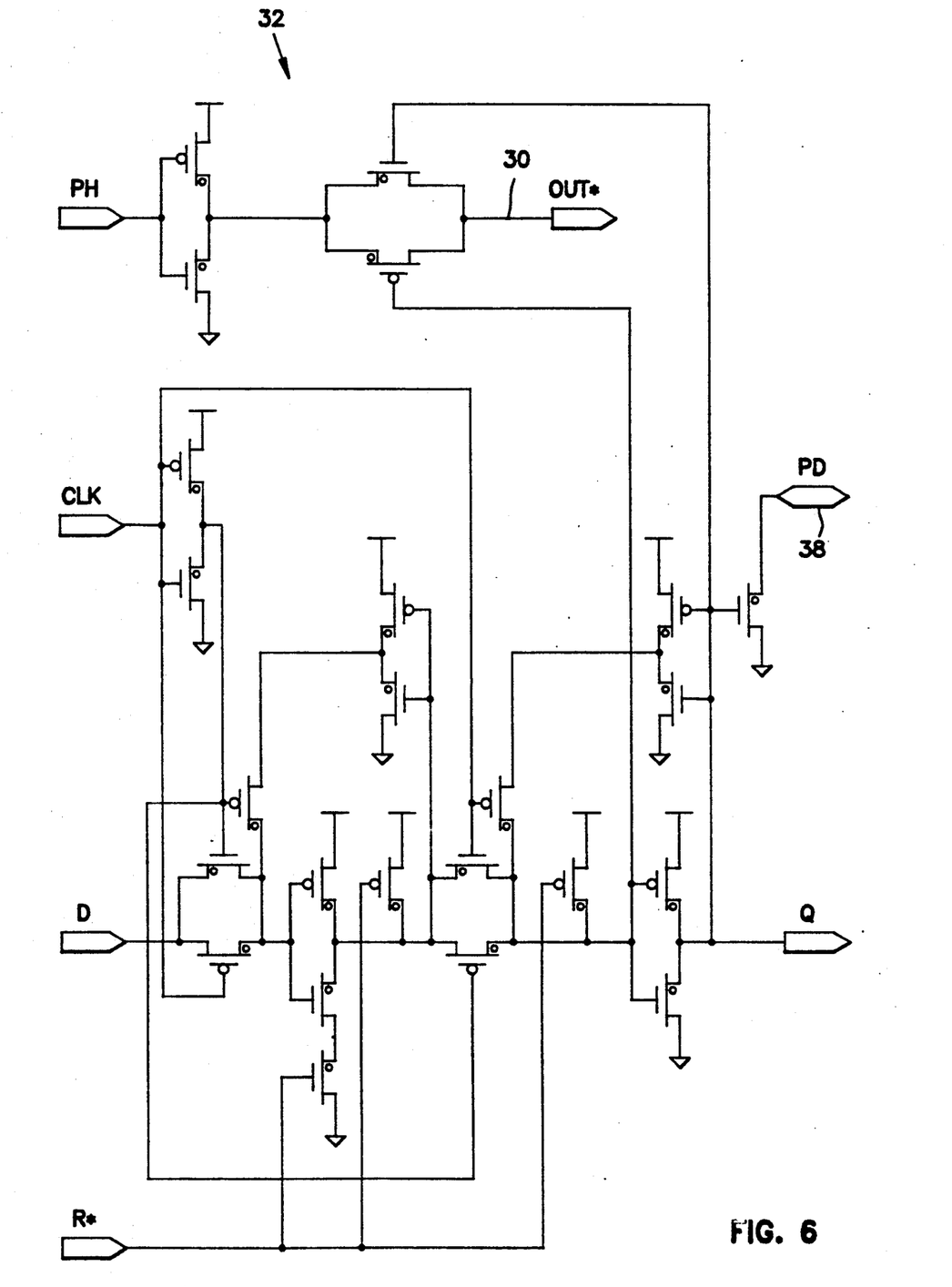
FIG. 6 is a schematic diagram of the TSELR portion of the Digital Phase Locked Loop of FIG. 3.
Figure 7:
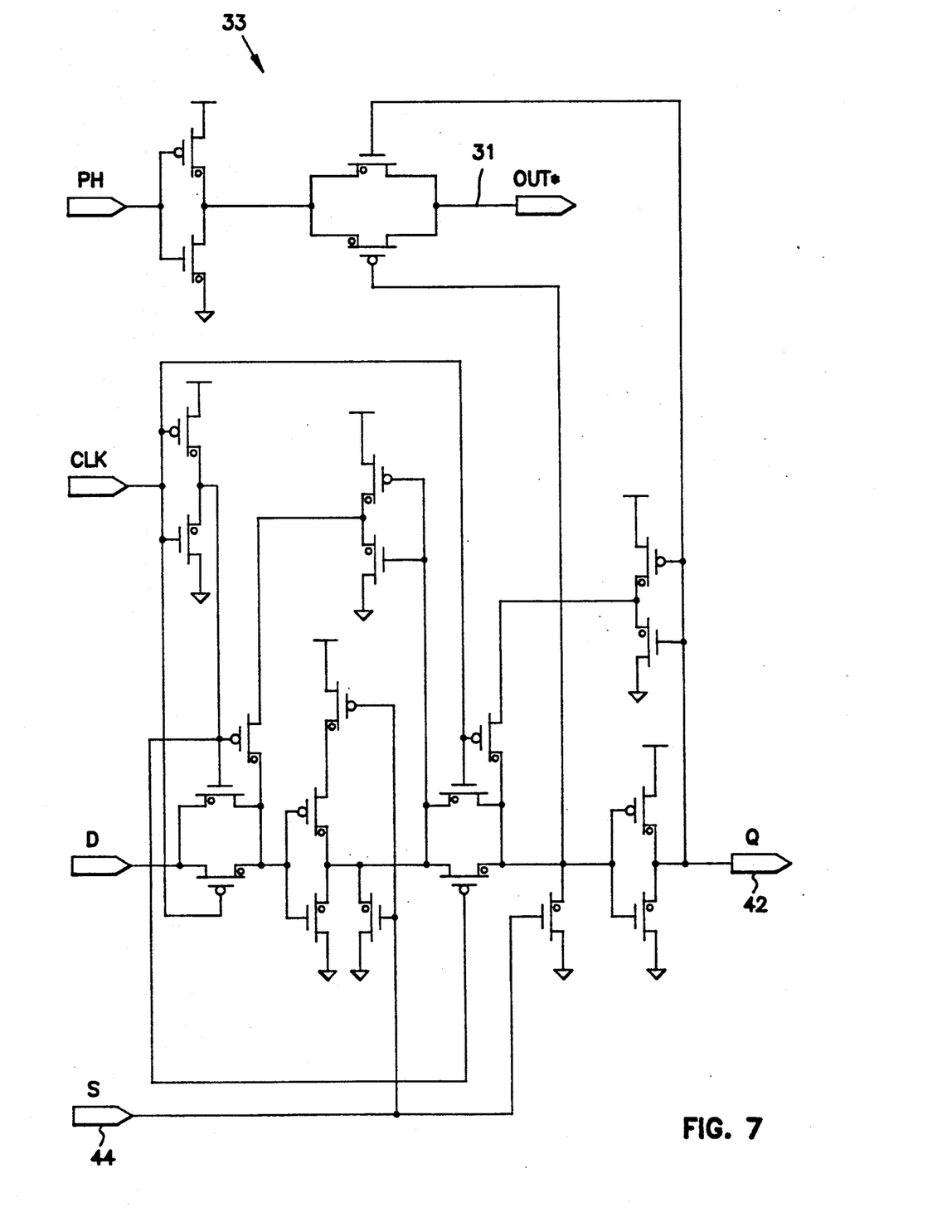
FIG. 7 is a schematic diagram of the TSELS portion of the Digital Phase Locked Loop of FIG. 3.

There is one TSELS and 9 TSELR's. The circuits TSELR (20,21,22,23,24,25,26,27,28) and TSELS (29) consist of a shift register flip flop whose output (30,31 in FIGS. 6 and 7) controls a multiplexer (mux) path. The input to the mux (32,33 in FIGS. 6 and 7) is a particular phase (6–15) of the ten phase clock from the ten stage ring oscillator 5. When the flip flop in any one of the circuits 20–29 is a '1' then that mux is selected. The outputs of all 10 muxes are connected together forming the signal MXOUT* 32. Since, the flip flops contain one circulating "1", the signal on MXOUT* 32 is one phase of the RXSPL oscillator 5 clocks. The TSELR (20–28)

has a reset input for the flip flop and TSELS 29 has a set input for its flip flop.

Figure 4:
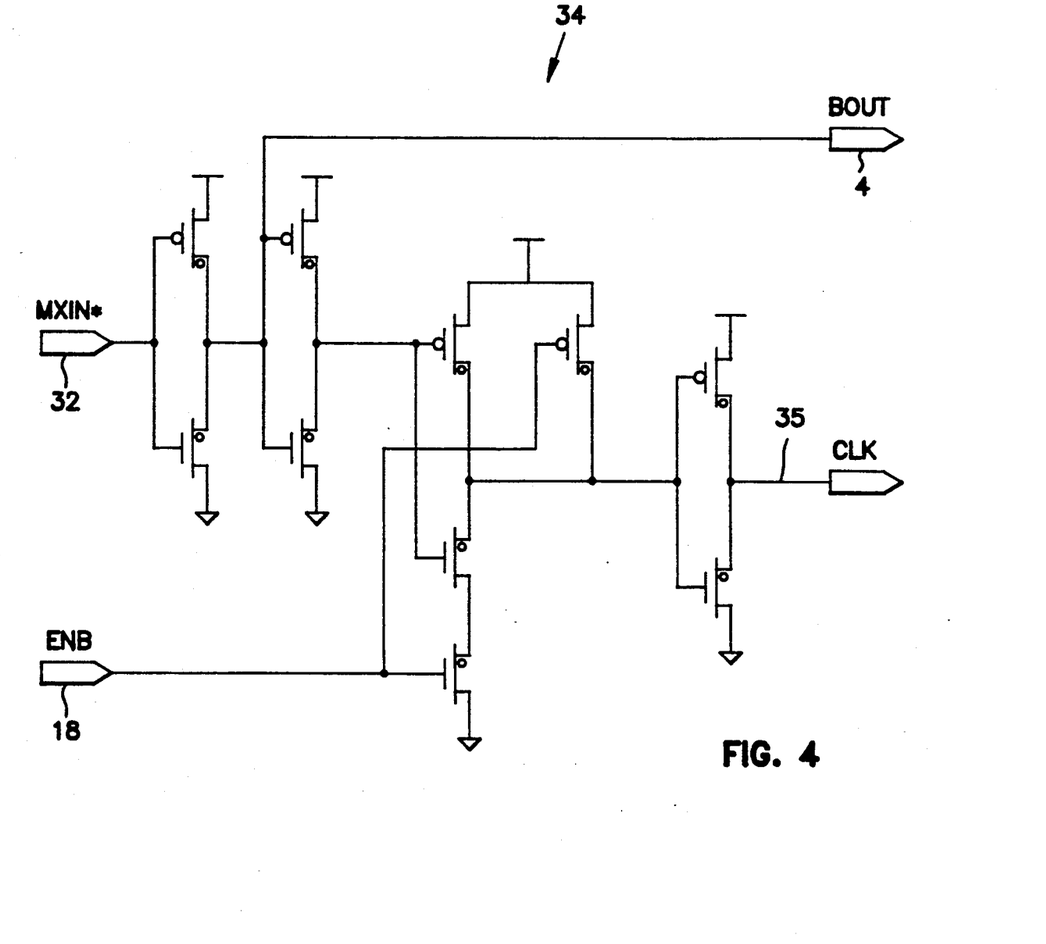
FIG. 4 is a schematic diagram of the TCKDR portion of the Digital Phase Locked Loop depicted in FIG. 3.

Referring to FIG. 4 the TCKDR circuit 34 consists of a buffer from MXOUT*32 to CKOUT 4. It also performs an "and" logic operation on the CKOUT signal 4 and the ADJ signal 19 to produce the shift register AJCK signal 35. The ADJ signal 19 is high, for one cycle of the CKOUT signal 4 if a frequency adjust (speed-up) is required. If the ADJ signal 19 is high, then the shift register clock AJCK signal 35 goes high when CKOUT 4 is low. This causes the shift register to make one shift, thereby selecting a previous phase of the currently selected clock phase. This causes a speed-up in the clock.

Figure 8:
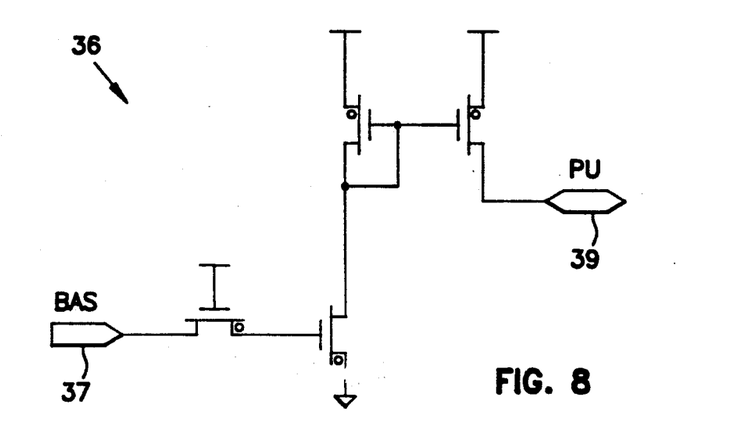
FIG. 8 is a schematic diagram of the PULUP portion of the Digital Phase Locked Loop of FIG. 3.

Referring to FIG. 8, the PULUP circuit 36 simulates a weak pull up resistor. The BAS input 37 is the current bias line from the master bias generator (not shown). The combination of the PULUP circuit 37 and the output 38 (PD) of the TSELR circuits 20-28 produces a nine input NOR gate. If all nine inputs are low the signal 39 (PU) is high.

Figure 5:
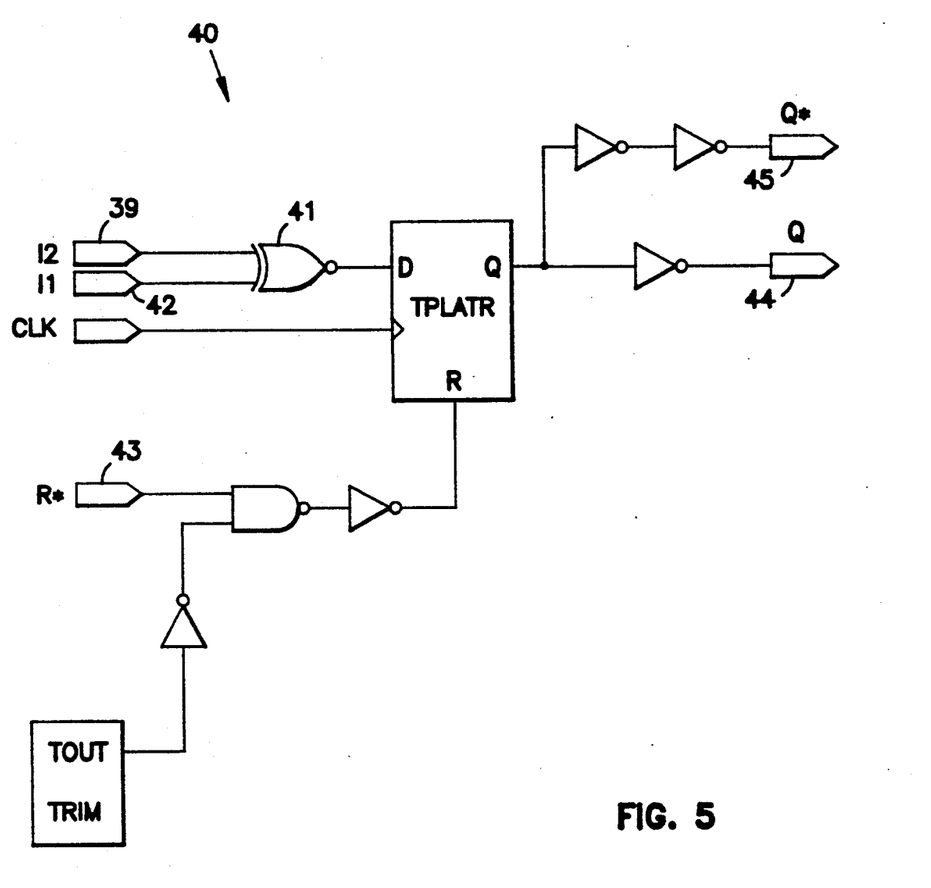
FIG. 5 is a schematic diagram of the TDFFRX portion of the Digital Phase Locked Loop of FIG. 3.

Referring to FIG. 5, the circuit 40 (TDFFRX) consists of an exclusive OR gate 41 and latch. The inputs to the exclusive OR gate 41 are signal 39 (PU) and the output signal 42 of TSELS terminal QO. If the inputs to the exclusive OR gate are both low or both high, it indicates an "no error" condition. An error condition is detected if the shift register has all zeros or more than one '1' circulating in it. If an error condition occurs, the R output 44 of the TDFFRX circuit 40 goes high for one cycle of the signal 6 phase of the ten stage ring oscillator 5 clocks. The R signal 44 sets the flip flop in TSELS 29 (FIG. 7) and the R* signal 45 resets the flip flops in all TSELR blocks (20-28), thus clearing the error condition.

In operation, the inputs to the ADJFREQ circuit 16 are the ten clock phases 6-15) from the ten stage ring oscillator 5, an ADJ signal 19 which goes high for one cycle of the output clock (CKOUT 4 when a frequency adjust (speed-up) is required, a RST* signal 43 to initialize the flip flops in TSELR (20-28) and TSELS 29 and a current reference 37 (BAS) line.

We claim:

1. A data recovery apparatus, comprising:
  (a) a phase lock loop for receiving an input signal having a frequency $F_i$ and a clock signal having a frequency $F_c$, and for generating an output signal having a frequency $F_o$ that tracks and locks to the input signal, wherein the phase lock loop divides the clock signal by a variable N to provide the output signal;
  (b) oscillator means for generating the clock signal, the oscillator means comprising means for generating a plurality W of phase output signals, each phase output signal having a different phase at the frequency $F_c$ such that between adjacent phase output signals there is a time offset $D = 1/(W*F_c) = 1/(W*N*F_i)$; and
  (c) phase selection means, responsive to the output signal from the phase lock loop, for selecting among the phase output signals and for providing the selected phase output signal as the clock signal, wherein the phase selection means selects a next phase output signal of the oscillator means whenever a mark is received on the input signal, so that the output signal is offset from the input signal by a maximum $1/(N*W)$ unit intervals before being corrected by the phase lock loop, thereby providing a jitter on the output signal having a high frequency component characterized by a frequency equal to $F_i/W$, and a low frequency component characterized by an amplitude equal to $1/(N*W)$ unit intervals.

2. The apparatus of claim 1, wherein the phase look loop further comprises a phase detector for comparing the input signal and the output signal and for generating an error signal in response to any difference between the input signal frequency $F_i$ and the output signal frequency $F_o$.

3. The apparatus of claim 1, wherein each phase output signal is phase offset from adjacent phase output signals by 350°/W.

4. The apparatus of claim 1, wherein the phase selection means comprises:
  (1) a shift register having a plurality of stages, wherein each stage output signal represents a respective phase output signal; and
  (2) means for cycling a high bit through the shift register, wherein the presence of the high bit in a particular stage of the shift register causes the selection of the respective phase output signal.

5. The apparatus of claim 4, wherein the means for cycling comprises means for shifting the high bit by one stage in the shift register when a mark is received on the input signal.

6. The apparatus of claim 4, further comprising reset means for monitoring the stages of the shift register and resetting the shift register when more or less than one high bit is detected therein.

7. A method for reducing jitter in a phase lock loop, comprising the steps of:
  (a) receiving an input signal having a frequency $F_i$ and a clock signal having a frequency $F_c$, and generating an output signal having a frequency $F_o$ that tracks and locks to the input signal, wherein the clock signal is divided by a variable N to provide the output signal;
  (b) generating a plurality W of phase output signals, each phase output signal having a different phase at the frequency $F_c$ such that between adjacent phase output signals there is a time offset $D = 1/(W*F_c) = 1/(W*N*F_i)$; and
  (c) selecting among the phase output signals in response to the output signal and providing the selected phase output signal as the clock signal, wherein a next phase output signal is selected whenever a mark is received on the input signal, so that the output signal is offset from the input signal by a maximum $1/(N*W)$ unit intervals before being corrected by the phase lock loop, thereby providing a jitter on the output signal having a high frequency component characterized by a frequency equal to $F_i/W$, and a low frequency component characterized by an amplitude equal to $1/(N*W)$ unit intervals.

8. The method of claim 7, further comprising comparing the input signal and the output signal, and generating an error signal in response to any difference between the input signal frequency $F_i$ and the output signal frequency $F_o$.

9. The method of claim 7, wherein each phase output signal is phase offset from adjacent phase output signals by 360°/W.

10. The method of claim 7, wherein the selecting step comprises cycling a high bit through a shift register having a plurality of stages, wherein each stage output signal represents a respective phase output signal, so that the presence of the high bit in a particular stage of the shift register causes the selection of the respective phase output signal.

11. The method of claim 10, wherein the cycling step comprises shifting the high bit by one stage in the shift register when a mark is received on the input signal.

12. The method of claim 10, further comprising monitoring the stages of the shift register and resetting the shift register when more or less than one high bit is detected therein.

* * * * *

UNITED STATES PATENT AND TRADEMARK OFFICE
CERTIFICATE OF CORRECTION

PATENT NO. : 5,077,529

DATED : December 31, 1991

INVENTOR(S) : Sajol C. Ghoshal et al.

It is certified that error appears in the above-identified patent and that said Letters Patent is hereby corrected as shown below:

In the Abstract, lines 3-4 and 7-8, "Digital Phase lock loop" should read --Digital Phase Lock Loop--.

Column 1, lines 20 and 22, "locked loop" should read --Locked Loop--.

Column 1, line 59, "relationation" should read --relaxation--.

Column 2, line 41, "convential" should read --conventional--.

Column 3, lines 32-33, "digital phase lock loop" should read --Digital Phase Lock Loop--.

Column 3, lines 38, 43 and 46, "digital phase lock loop" should read --Digital Phase Lock Loop--.

Column 3, line 66, insert --to-- after the word "order".

Column 4, lines 24, 25 and 27, "resister" should read --register--.

Column 4, line 29, "digital phase locked loop" should read --Digital Phase Locked Loop--.

Column 4, lines 44, 46, 49, 51 and 52, "resister" should read --register--.

UNITED STATES PATENT AND TRADEMARK OFFICE
CERTIFICATE OF CORRECTION

PATENT NO. : 5,077,529

DATED : December 31, 1991

INVENTOR(S) : Sajol C. Ghoshal et al.

It is certified that error appears in the above-identified patent and that said Letters Patent is hereby corrected as shown below:

Column 4, line 51, "correct" should read --corrects--.
Column 5, line 39, delete "(" after the word "clock".
Column 6, claim 2, line 6, "look" should read --lock--.

Signed and Sealed this

Twenty-seventh Day of April, 1993

Attest:

MICHAEL K. KIRK

Attesting Officer

Acting Commissioner of Patents and Trademarks